United States Patent
Hsu et al.

(10) Patent No.: US 7,820,556 B2
(45) Date of Patent: Oct. 26, 2010

(54) METHOD FOR PURIFYING ACETYLENE GAS FOR USE IN SEMICONDUCTOR PROCESSES

(75) Inventors: Gishun Hsu, Santa Clara, CA (US); Charles Merrill, Portland, OR (US); Scott Stoddard, Sherwood, OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 12/133,223

(22) Filed: Jun. 4, 2008

(65) Prior Publication Data

US 2009/0305516 A1 Dec. 10, 2009

(51) Int. Cl.
*H01L 21/02* (2006.01)
(52) U.S. Cl. .............. 438/758; 438/780; 257/E21.002; 257/E21.24
(58) Field of Classification Search ................ 438/478, 438/503, 758, 584, 780; 257/E21.001, E21.002, 257/E21.24
See application file for complete search history.

(56) References Cited

U.S. PATENT DOCUMENTS

| | | | |
|---|---|---|---|
| 4,668,261 A | 5/1987 | Chatzipetros et al. | |
| 4,863,493 A * | 9/1989 | Kotani et al. | 95/14 |
| 4,863,760 A | 9/1989 | Schantz et al. | |
| 5,261,250 A | 11/1993 | Missimer | |
| 5,378,316 A | 1/1995 | Franke et al. | |
| 5,470,661 A | 11/1995 | Bailey et al. | |
| 6,030,591 A | 2/2000 | Tom et al. | |
| 6,066,209 A | 5/2000 | Sajoto et al. | |
| 6,150,719 A | 11/2000 | Saia et al. | |
| 6,241,793 B1 | 6/2001 | Lee et al. | |
| 6,286,321 B1 | 9/2001 | Glater | |
| 6,319,299 B1 | 11/2001 | Shih et al. | |
| 6,331,480 B1 | 12/2001 | Tsai et al. | |
| 6,541,397 B1 | 4/2003 | Bencher | |
| 6,573,030 B1 | 6/2003 | Fairbairn et al. | |
| 6,617,553 B2 | 9/2003 | Ho et al. | |
| 6,967,072 B2 | 11/2005 | Latchford et al. | |
| 7,223,526 B2 | 5/2007 | Fairbairn et al. | |
| 7,314,506 B2 | 1/2008 | Vininski et al. | |
| 7,323,401 B2 * | 1/2008 | Ramaswamy et al. | 438/551 |
| 7,381,644 B1 | 6/2008 | Subramonium et al. | |
| 2001/0021491 A1 | 9/2001 | Chen et al. | |

(Continued)

OTHER PUBLICATIONS

U.S. Office Action mailed Jan. 5, 2009, from U.S. Appl. No. 11/449,983.

(Continued)

*Primary Examiner*—Matthew Smith
*Assistant Examiner*—Michele Fan
(74) *Attorney, Agent, or Firm*—Weaver Austin Villeneuve & Sampson LLP

(57) ABSTRACT

Acetylene is treated to remove some residual storage solvent that may be present with the acetylene in a source of acetylene such as a container. Such treatment may be performed prior to supplying the acetylene to a deposition chamber or other reactor where acetylene is a reactant. After treatment, the acetylene gas stream has a relatively constant concentration of storage solvent, regardless of how much acetylene has been released from the acetylene source. The treatment may involve condensing the storage solvent from the gas stream at a certain temperature and separating the storage solvent from the gas stream.

28 Claims, 7 Drawing Sheets

U.S. PATENT DOCUMENTS

| | | | |
|---|---|---|---|
| 2002/0182848 | A1 | 12/2002 | Joseph et al. |
| 2003/0044532 | A1 | 3/2003 | Lee et al. |
| 2004/0016972 | A1 | 1/2004 | Singh et al. |
| 2004/0018750 | A1 | 1/2004 | Sophie et al. |
| 2004/0023502 | A1 | 2/2004 | Tzou et al. |
| 2004/0140506 | A1 | 7/2004 | Singh et al. |
| 2004/0180551 | A1 | 9/2004 | Biles et al. |
| 2004/0266195 | A1 | 12/2004 | Dokumaci et al. |
| 2005/0042889 | A1 | 2/2005 | Lee et al. |
| 2005/0098119 | A1 | 5/2005 | Burger et al. |
| 2005/0112506 | A1 | 5/2005 | Czech et al. |
| 2006/0091559 | A1 | 5/2006 | Nguyen et al. |
| 2006/0197881 | A1 | 9/2006 | Kang et al. |
| 2007/0048674 | A1 | 3/2007 | Wells |
| 2007/0059913 | A1 | 3/2007 | King et al. |
| 2007/0125762 | A1 | 6/2007 | Cui et al. |
| 2007/0128538 | A1 | 6/2007 | Fairbairn et al. |
| 2007/0166546 | A1 | 7/2007 | Ichikawa et al. |
| 2007/0166979 | A1 | 7/2007 | Wang et al. |
| 2007/0247073 | A1 | 10/2007 | Paterson et al. |
| 2008/0128907 | A1 | 6/2008 | Yang et al. |
| 2008/0242912 | A1* | 10/2008 | Letessier et al. ............ 585/821 |
| 2008/0254641 | A1 | 10/2008 | Kobayashi et al. |
| 2009/0182180 | A1* | 7/2009 | Huang et al. .................. 585/16 |

OTHER PUBLICATIONS

U.S. Office Action mailed Jan. 5, 2009, from U.S. Appl. No. 11/710,377.

Henri, et al., Method for Improved Thickness Repeatability of PECVD Deposited Carbon Films, Novellus Systems, Inc., U.S. Appl. No. 12/334,220, filed Dec. 12, 2008.

U.S. Office Action mailed Dec. 14, 2006, from U.S. Appl. No. 11/318,269.

Ikeda et al., "Top-PECVD": A New Conformal Plasma Enhanced CVD Technology using TEOS, Ozone and Pulse-modulated RF Plasma, 1992 IEEE, pp. 11.2.1-11.2.4.

Subramonium et al., "Methods of Depositing Highly Selective Transparent Ashable Hardmask Films", U.S. Appl. No. 11/449,983, filed Jun. 8, 2006.

Subramonium et al., "Methods of Depositing Stable and Hermetic Ashable Hardmask Films," Novellus Systems, Inc., U.S. Appl. No. 11/710,377, filed Feb. 22, 2007, pp. 1-26.

Notice of Allowance and Fee Due mailed May 7, 2007 from U.S. Appl. No. 11/318,269.

Allowed Claims from U.S. Appl. No. 11/318,269.

Fang et al., "Methods of Improving Ashable Hardmask Adhesion to Metal layers," Novellus Systems, Inc., U.S. Appl. No. 11/612,382, filed Dec. 18, 2006.

U.S. Office Action mailed Oct. 9, 2007, from U.S. Appl. No. 11/612,382.

Grill, et al. "Diamondlike carbon films by rf plasma-assisted chemical vapor deposition from acetylene," IBM J. Res. Develop., vol. 34, No. 6, Nov. 1990, pp. 849-857.

Callegari et al., "Optical properties of hydrogenated amorphouscarbon film for attenuated phase-shift mask applications," J.Vac. Sci. Technol. B 11(6), Nov./Dec. 1993, pp. 2697-2699.

Grill, A., "Diamond-like carbon: state of the art," Diamond and Related Mateials 8 (1999) 428-434.

Grill, A., "Plasma-deposited diamondlike carbon and related materials," IBM Journal of Research and Development, vol. 43, ½, 1999, http://research.ibm.com/journal/rd/431/grill.html. 14 pages.

Kragler et al., "Scanning tunneling microscopy based lithography employing amorphous hydrogenated carbon as a high resolution resist mask," Appl. Phys. Lett. 67 (8), Aug. 21, 1995, pp. 1163-1165.

U.S. Office Action mailed Dec. 27, 2007, from U.S. Appl. No. 11/449,983.

Subramonium et al., "Pulsed PECVD Method for Modulating Hydrogen Content in Hard Mask," Novellus Systems, Inc., U.S. Appl. No. 12/048,967, filed Mar. 14, 2008.

Subramonium et al., "Methods and Apparatus for Plasma-Based Deposition," Novellus Systems, Inc., U.S. Appl. No. 11/849,208, filed Aug. 31, 2007.

U.S. Office Action mailed Jul. 9, 2008, from U.S. Appl. No. 11/449,983.

U.S. Final Office Action mailed May 13, 2008, from U.S. Appl. No. 11/612,382.

U.S. Office Action mailed Aug. 19, 2008, from U.S. Appl. No. 11/612,382.

Subramonium et al., "Methods of Depositing Smooth and Conformal Ashable Hard Mask Films," Novellus Systems, Inc., U.S. Appl. No. 12/163,670, filed Jun. 27, 2008.

Holmes, et al., "Trimethylsilylacetylene," Organic Syntheses, Coll. vol. 8, p. 606 (1993); vol. 65, p. 61 (1987).

Voronkin et al., "Structure and mechanical properties of a-C:H films deposited onto polymer substrates," Diamond and Related Materials, 4 (1994) 5-9.

U.S. Appl. No. 11/612,382, Office Action mailed Feb. 24, 2009.
U.S. Appl. No. 11/612,382, Office Action mailed May 12, 2009.
U.S. Appl. No. 11/710,377, Office Action mailed Aug. 19, 2009.
U.S. Appl. No. 11/449,983, Office Action mailed Sep. 15, 2009.
U.S. Appl. No. 11/710,652, Office Action mailed Nov. 20, 2009.
U.S. Appl. No. 11/612,382, Office Action mailed Dec. 9, 2009.

* cited by examiner

METHOD FOR PURIFYING ACETYLENE GAS FOR USE IN SEMICONDUCTOR PROCESSES

FIELD OF THE INVENTION

This invention relates to electronic devices and associated fabrication processes. More specifically, the invention relates to technology for purifying acetylene gas for us in semiconductor processes and for achieving substantially constant concentration of residual vapor of the packing or storage solvent, such as acetone, in an acetylene gas stream delivered to a deposition chamber.

BACKGROUND OF THE INVENTION

Acetylene is known to be explosive when pressurized above 15 psig. Therefore, storage and transportation of acetylene presents a set of challenges. One way to overcome these challenges is to dissolve acetylene in acetone, contained in a metal cylinder that is filled with porous material. Acetone is commonly used for such purpose because acetylene is highly soluble in acetone. One volume of liquid acetone can absorb twenty-five volumes of gaseous acetylene at temperatures of about 15° C. under atmospheric pressure and will continue to absorb an additional twenty-five volumes of acetylene for every additional atmosphere of pressure to which acetylene is subjected (*The Encyclopedia Britannica: A Dictionary of Arts, Sciences, Literature and General Information*, Hugh Chisholm, University Press 1910). Further, an acetylene gas stream recovered from an acetone solution carries a substantial amount of acetone vapor.

Overall, improved methods of treating acetylene gas prior to use in semiconductor processing is desired.

SUMMARY OF THE INVENTION

The concentration of acetone or other acetylene storage solvent in the acetylene gas stream varies substantially depending on the ratio of acetylene to acetone in the storage cylinder. Typically, the acetone content in the acetylene gas stream tends to increase as more acetylene is used from the cylinder. This presents a particular difficulty when using acetylene in processes where acetone, and particularly the relative amount of acetone in the acetylene, impacts the quality of the resulting product. The inventors have observed that providing acetylene from a tank as a precursor into a deposition chamber creates major problems during the deposition process as more acetylene is consumed from tank.

The present invention addresses this need by providing a method for treating an acetylene gas stream prior to supplying it to a deposition chamber without adversely impacting the deposition process. Specifically, some embodiments of the invention provide a substantially constant concentration of residual storage solvent in the acetylene gas stream. In certain embodiments, this is achieved by condensing the residual storage solvent vapor from the acetylene gas stream at a certain temperature; thus, separating the condensed acetylene storage solvent from the gas stream.

In one aspect, the invention relates to a method of treating an acetylene gas stream prior to use in forming a layer of carbon containing material (e.g., a relatively high carbon content material) on a semiconductor substrate during fabrication of an electronic device. The method involves delivering the acetylene gas stream to an inlet of an acetylene pre-processing module from an acetylene source, which source contains storage solvent in which acetylene is soluble. The storage solvent may evaporate during acetylene discharge from the acetylene storage. Therefore, the acetylene gas stream may include some storage solvent in the vapor form. The method also involves condensing the storage solvent from the acetylene gas stream in the pre-processing module to provide a reduced and, in certain specific embodiments, substantially constant, storage solvent concentration in the acetylene gas stream exiting the pre-processing module. The acetylene gas leaving the pre-processing module may then be delivered to a deposition chamber where it serves as a precursor for the high carbon content material. In certain embodiments, concentration of the storage solvent in the acetylene gas stream leaving the pre-processing module is less than 0.4% by volume.

The high carbon content material may include amorphous carbon and form an ashable hard mask on the semiconductor substrate. The delivery of the acetylene gas stream to the inlet of the acetylene pre-processing module may be performed at a pressure below 15 psig. In many embodiments, the storage solvent in which acetylene is dissolved in the acetylene source is acetone.

The pre-processing module may include various elements to remove the storage solvent and provide a modified gas stream having a constant, but reduced, concentration of the storage solvent in acetylene. Among the elements that may be included in the pre-processing module are a heat exchanger and a liquid trap. Further, in certain embodiments, the heat exchanger may be submerged in a bath filled with coolant. For a typical application, the heat exchanger will have surface area is between 100 square inches and 1000 square inches. The coolant may be maintained at temperature of no greater than about −35° C. The trap may include an insert having a plurality of tortuous paths for the acetylene gas stream to pass through.

The acetylene gas stream may flow at up to about 20 L/min during the time period during which the layer of high carbon content material is deposited. The reduced acetone concentration acetylene gas stream may be heated after solvent removal. For example, the gas stream may be heated to between about 10 to 40° C. before delivering it to the deposition chamber. The method may allow delivering no less than about 50% or even no less than about 75% of acetylene in the container to the inlet of the pre-processing module. Without removing storage solvent from the acetylene gas stream, the concentration of the storage solvent in the acetylene gas stream can vary substantially and an acetylene source may, in some applications, be useable only until a relatively small fraction of the source acetylene is consumed. After that point, the storage solvent concentration is too great and the deposited film has poor quality.

In accordance with certain embodiments, the deposition rate of the layer of high carbon content material deposited on the semiconductor substrate may vary less than about 2%, over the period during which the acetylene gas stream is supplied from a single container. The layer of high carbon content material may be deposited on the semiconductor substrate using Plasma Enhanced Chemical Vapor Deposition (PECVD) that includes a Low Frequency (LF) plasma generator and a High Frequency (HF) plasma generator.

In another aspect, the invention pertains to pre-processing module apparatus. The pre-processing module may include an inlet having a connector adapted for connecting to the acetylene source, a heat exchanger, a trap configured to accumulate condensed liquid from an acetylene gas stream, and an outlet having a connector adapted to the deposition chamber. The heat exchanger may have surface area between 100 square inches and 1000 square inches and may include a first coil and a second coil, where the acetylene gas stream from the inlet enters the first coil then passes through the trap and into the second coil attached to the outlet. The trap may include one or more tortuous paths for the acetylene gas stream to pass through during which condensation of the storage solvent is facilitated. The pre-processing module may also include a bath, which contains the heat exchanger and the trap inside.

These and other features and advantages will be described in more detail below with reference to the associated drawings.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Many of the process parameters listed here correspond to a Novellus Vector™ module having four stations for depositing an ashable hard mask on a 300 mm wafer. However, the invention applies to any semiconductor deposition chamber using acetylene gas stream for semiconductor processing. One skilled in the art will readily appreciate that the process parameters may be scaled based on the deposition chamber volume, wafer size, and other factors. For example, power outputs of LF and HF generators are typically directly proportional to the deposition surface area of the wafer. The power used on 300 mm wafer is generally 2.25 times higher than the power used for 200 mm wafer. Similarly, flow rates depend on the free volume of the deposition chamber, which is 195 L for each of four Novellus Vector™ deposition chambers.

Figure 1:
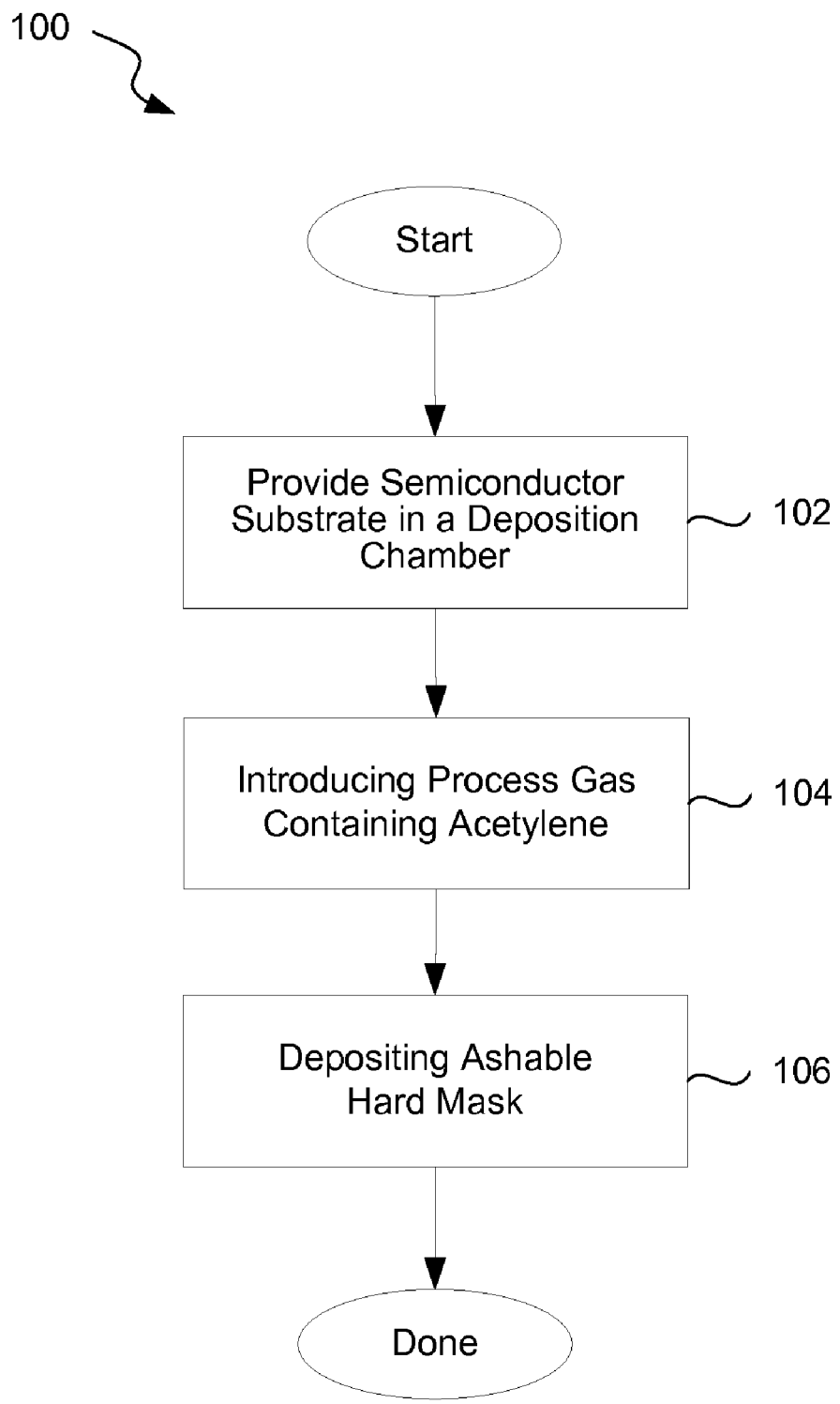
FIG. 1 is a flowchart illustrating important stages in a general process flow for a method of forming ashable hard mask in accordance with the present invention.

FIG. 1 illustrates stages in a general process flow for forming an ashable hard mask in accordance with certain embodiments of the present invention. It should be understood that the invention is not limited to ashable hard mask deposition processes or even to semiconductor fabrication applications. In the depicted embodiment, the method 100 begins with providing a semiconductor substrate in a deposition chamber (block 102). For example, a semiconductor substrate could be a 300-mm semiconductor wafer suitable for a Novellus Vector™ module. A precursor process gas comprising acetylene is then introduced into the chamber (block 104). Depending on deposition chamber size and other process parameters the flow rate of acetylene may be about 3,000-10,000 sccm during the deposition process. In one embodiment, the flow rate of acetylene may be about 5,000-8,000 sccm. Other stages of semiconductor processing, such as cleaning of the chamber, may not involve carbon containing precursors. The process gas may also include other carbon containing precursors, such as methane, ethylene, propylene, butane, cyclohexane, benzene and toluene, and others.

A carrier gas may be used to dilute the precursor. The carrier gas may include any suitable carrier gas employed in semiconductor processing, such as helium, argon, nitrogen, hydrogen, or a combination of these. The overall carrier gas flow rate may depend on deposition chamber size and other process parameters and may range from about 500 to 10,000 sccm. In a specific embodiment nitrogen and helium are used as carrier gases having corresponding flow rates ranges of about 500-5,000 sccm and about 300-3,000 sccm. Other stages of semiconductor processing may include different processing gases and different flow rates.

In the depicted embodiment, an ashable hard mask is then deposited on the semiconductor substrate by a plasma enhanced chemical vapor deposition (PECVD) or other deposition processes (block 106). Plasma may be generated using dual-frequency plasma generation process. For example, a low frequency (LF) generator may provide about 200-1000 W at about 50-400 kHz, while a high frequency (HF) generator may provide about 500-2,000 W at about 2-60 MHz during the deposition process. Additional description of a suitable process apparatus is provided in the context of FIG. 8. The deposition process may be performed when substrate temperature is between about 100 and 500° C. The pressure of the deposition chamber may be maintained at about 2-15 Torr. One example of the process conditions for ashable hard mask deposition is summarized in Table 1. Deposition is continued until the desired thickness of film is deposited. According to various embodiments, between about 1,000 and 9,000 angstroms is deposited.

TABLE 1

| Parameter | Typical Process Range |
| --- | --- |
| $C_2H_2$ Flow Rate | 3,000-10,000 sccm |
| $N_2$ Flow Rate | 500-5,000 sccm |
| He Flow Rate | 300-3,000 sccm |
| LF Power at Frequency | 200-1000 W at 50-400 kHz |
| HF Power at Frequency | 500-2,000 W at 2-60 MHz |
| Pressure | 2-15 Torr |
| Temperature | 150-600° C. |

Figure 2:
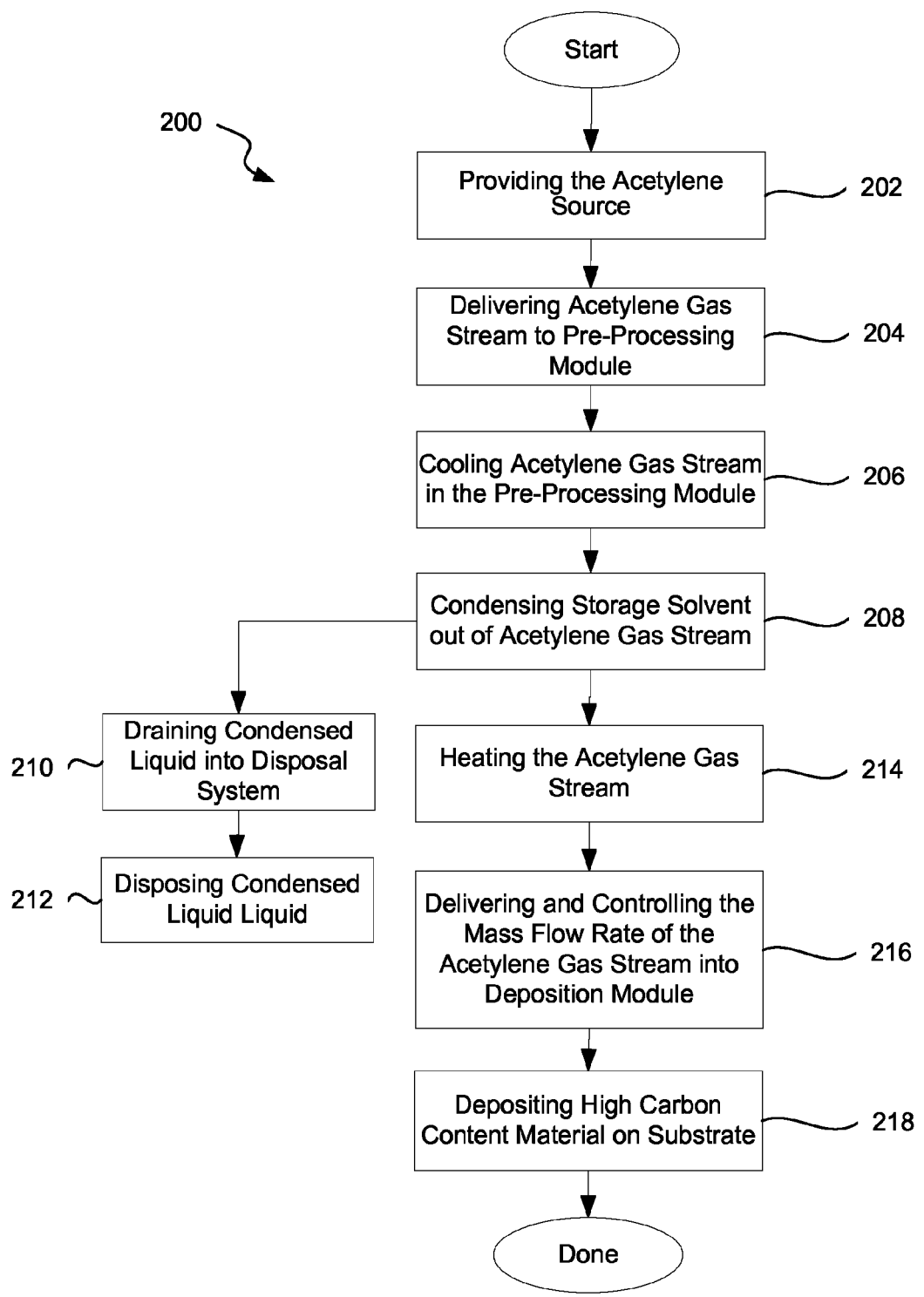
FIG. 2 is a flowchart illustrating important stages in a general process flow for a method of treating an acetylene gas stream in accordance with the present invention.

FIG. 2. is a flowchart illustrating some stages in a general process flow for a method of treating an acetylene gas stream in accordance with certain embodiments. The process starts with providing an acetylene source 202. By way of example, acetylene for semiconductor processing is usually supplied in cylinders (also referred to as bottles) storing 200-500 cubic feet of acetylene (at standard temperature and pressure) where acetylene is dissolved in acetone. Acetylene may also be dissolved in dimethylformamide (DMF) or contained in a metal cylinder with porous material, such as agamassan. Acetylene vendors include Dow Chemicals, Air Products, PraxAir, Air Gas and other suppliers. Acetylene can begin to decompose at pressures above 15 psig. Considerable amounts of heat can be generated from the decomposition of acetylene, which can result in explosions of great force. For theses reasons, acetylene cylinders are supplied with safety pressure regulators that limit the pressure in receiving lines to 15 psig. However, the overhead pressure inside the cylinder may reach and exceed 200 psi by means of various safety devices and techniques. Considering that deposition chambers are usually operated at low pressures, 15 psig or less is a sufficiently high driving pressure to flow an acetylene gas stream through a pre-process module and into the deposition chamber. For example, a typical deposition process using Novellus Vector apparatus requires a flow rate of about 6750 standard cubic centimeters per minute (sccm) (6.75 L/min) while the deposition chamber is maintained at 8 Torr. As discussed above, flow rates and chamber pressures may vary depending on process requirements.

Returning to FIG. 2, the next operation involves delivering acetylene from the acetylene source to the pre-processing module. The delivery of the acetylene into the pre-processing module 204 is driven by the pressure differential within the overall system and may be controlled by a valve on acetylene source and a mass flow controller between the pre-processing module and the deposition chamber. Typically, the pressure drop within the pre-processing module is not substantial and depends on lengths and effective diameters all paths that acetylene gas stream takes. Additionally, the pressure drop may be affected by the temperature and the composition of the acetylene gas stream. Once the acetylene gas stream fills the pre-processing module after opening the valve on the acetylene source, the acetylene gas stream may experience at least two flow regimes. One is when the deposition process operation does not require any acetylene, for example during the deposition chamber cleaning, and the acetylene gas stream remains stationary inside the pre-processing module. Another regime is when the acetylene gas stream flows through the pre-processing module and into the deposition chamber. The method and apparatus is designed in such way that a substantially constant concentration of the acetylene storage solvent of no greater than about 0.4% or even no greater than about 0.3% by volume in the reduced storage solvent concentration acetylene gas stream is maintained regardless of duration of either of the flow regimes.

As the acetylene gas stream flows through the pre-processing module it is cooled to a certain temperature (block 206). This facilitates condensation and removal of the acetylene storage solvent. The pre-processing module may include a variety of means to achieve the requisite cooling. In a specific embodiment, the acetylene gas stream passes through a heat exchanger that is maintained in contact with a cooler material. A variety of heat exchanger types may be used for cooling, for example a shell and tube heat exchanger, a plate heat exchanger, a regenerative heat exchanger, an adiabatic wheel heat exchanger, and others. In a specific embodiment a set of two spiral heat exchangers is used. Additional details of the pre-processing module are described below in the context of FIG. 4.

The heat exchanger may be submerged into a bath containing coolant. In a specific embodiment, the heat exchangers are submerged in ethylene glycol maintained at temperatures of −30° C. to −60° C. The design of the heat exchangers and the flow rate of the acetylene gas stream are such that the temperature of the stream leaving the heat exchangers is within a few degrees from the temperature of the coolant. When entering the pre-process module the acetylene gas stream may contain between about 0.5% to 5% of the storage solvent vapor. In a preferred embodiment, acetone is the storage solvent. The boiling point of acetylene at normal conditions is −84° C., while the boiling point of acetone is 56° C. Lowering the temperature of the acetylene gas stream can further reduce the acetone vapor in the acetylene gas stream by condensation. The concentration of acetone or any other storage solvent vapor remaining in the gaseous acetylene (after condensation of storage solvent vapor) depends on the temperature of the acetylene gas stream in the heat exchangers, the initial concentration of the acetone in the stream, the flow rates of the stream, and other process parameters. While lower temperatures are preferable for removing more acetone or other storage solvents from the stream, more acetylene can dissolve in the condensed liquid acetone. Therefore, an optimal temperature for the existing acetylene gas stream is based on desired final concentrations of acetone, losses of acetylene, and overall pre-processing module design.

The condensation of the storage solvent typically occurs on the inside walls of the heat exchangers. The surface area of the walls of the heat exchangers is sufficiently large to provide adequate heat transfer and condensation. The condensed storage solvent progresses gravitationally and by gas pressure through the heat exchangers and to the bottom of the liquid trap, where it is temporary collected before being drained into a disposal system. The acetylene gas stream also passes through the trap while carrying some liquid storage solvent droplets in the mist form that may be removed in a mist barrier.

When the liquid level at the bottom of the trap reaches or exceeds the set maximum level, the level sensor ensures that the liquid is drained into the disposal system (see block 210). In a preferred embodiment, the level sensor sends a signal to the control system that opens a draining valve of the disposal system. The liquid is then gravitationally drained into a collection canister, which is maintained at low overhead gas pressures for safety reasons. The condensed storage solvent may contain substantial amount of highly soluble acetylene. Some of this acetylene may be evaporated from the storage solvent, which may be vented into an abatement unit. The storage solvent is then disposed (see block 212). A variety of methods may be used for abatement of the storage solvent. Alternatively, the liquid can be incinerated by burning.

The reduced storage solvent concentration acetylene gas stream is then passed through the heater to increase the temperature of the stream to a level suitable for operation of the mass flow controller for use in the deposition process. The temperature of the stream leaving the heat-exchangers and trap portions of pre-processing module may be close to the temperature of the coolant. In one embodiment where the storage solvent is acetone, the heat-exchange fluid may be kept at about −30° C. to −60° C. In one embodiment, the gas stream of acetylene and remaining acetone is heated to about between about 10° C. and 40° Additionally, the heater may be designed to avoid overheating of the reduced storage solvent concentration acetylene gas stream especially when the stream is stagnant in the heater and the deposition process operation does not require any acetylene.

Returning to FIG. 2, the gas stream then flows through the mass flow controller and into the deposition chamber. A deposition process (block 218) requires delivery of the reduced storage solvent concentration acetylene gas stream at controlled flow rates and only during the certain operations, such as ashable mask pre-coat and ashable mask deposition. The delivery rate and timing is controlled using a mass flow controller.

Finally, the acetylene gas stream is delivered into the deposition chamber where the high carbon content material is deposited on the substrate. In general, a high carbon content material is a material containing at least about twenty five atomic percent carbon and frequently at least about fifty atomic percent carbon. For diamond-like and graphite films carbon may account for up to 100 atomic percent of the films.

In one embodiment, a process for depositing the ashable hard mask may includes the following operations: undercoat deposition, ashable hard mask pre-coat, ashable hard mask deposition, chamber cleaning at high pressure, and chamber cleaning at low pressure. The acetylene gas mass flow controller is shut during the remaining operations not involving the pre-coat or ashable hard mask deposition, which may be a significant part of the overall process. However, the valve from the acetylene source may remain open during this period and the acetylene gas stream remains in the pre-process module pressurized by the acetylene source.

Figure 3:
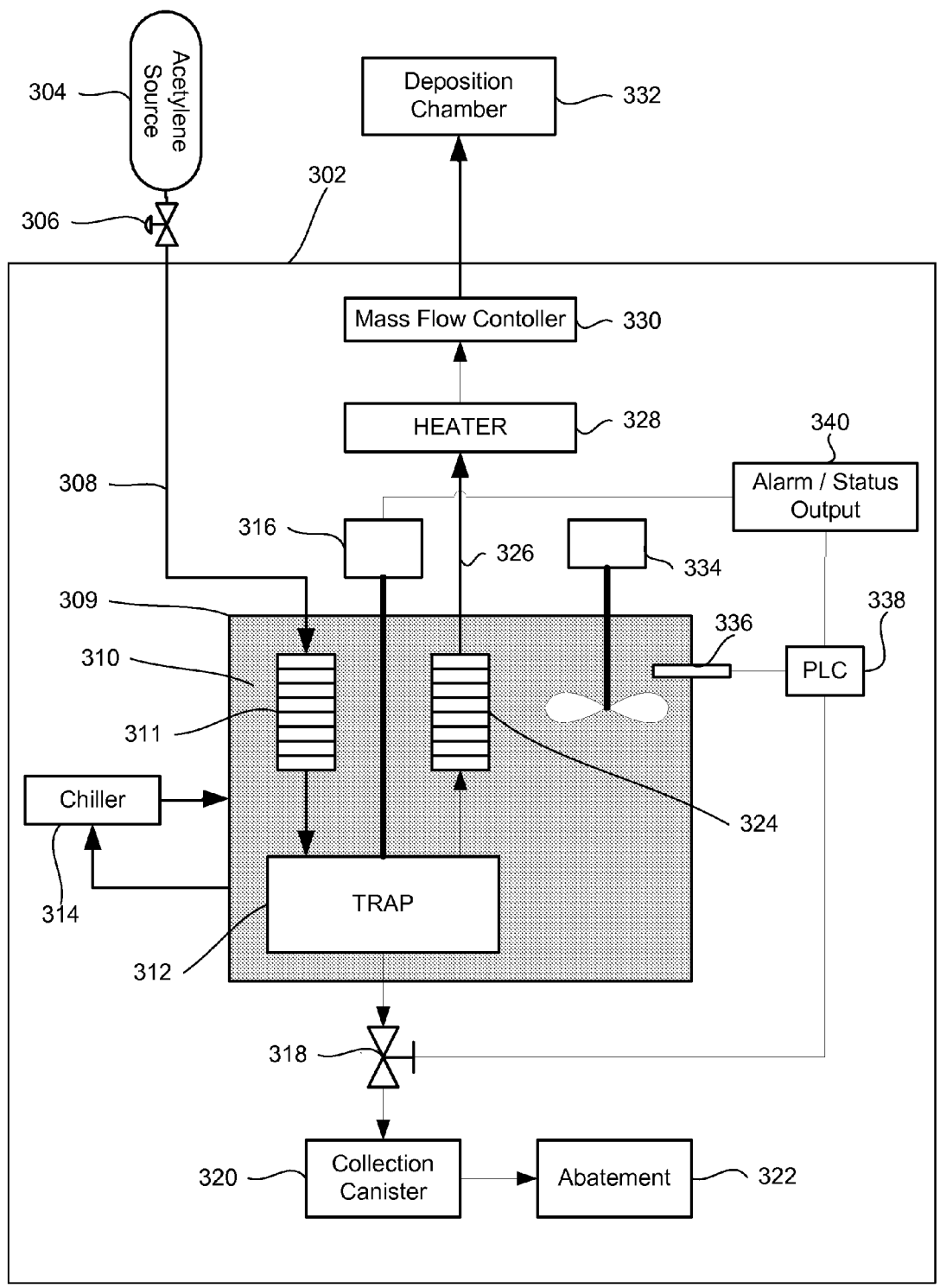
FIG. 3 presents a simple block diagram depicting a pre-processing module and other related apparatuses arranged for implementing the present invention.

FIG. 3 presents a simple block diagram depicting a pre-processing module 302 and other related apparatuses, such as an acetylene source 304 with a corresponding pressure regulator 306 and a deposition chamber 332. The acetylene source 304 contains acetylene dissolved in storage solvent. As mentioned, the storage solvent may be acetone or other liquid in which acetylene dissolves. Typically, the acetylene source 304 is pressured to over 200 psi. The acetylene source may be a tank or a facility wide supply of acetylene (e.g., an acetylene resource plumbed into the facility). In a preferred embodiment, the acetylene source 304 is a cubic feet acetylene cylinder that contains a filler material and a solvent in addition to the safety relief devices. Usually standard-sized hollow steel cylinders generally used for compressed gas service are also used for acetylene. In specific example, a 390 cubit feet acetylene cylinder that contains approximately 27 lbs of acetylene and approximately 49 lbs of acetone and filled with porous calcium silicate may be used. The cylinder may be used at service pressure of 250 psi at 70° F.

When the acetylene gas stream is discharged from the acetylene source 304, it first passes through the pressure regulator 306 where the service pressure of the cylinder is reduced to a safe level below 15 psig. The acetylene is then passed through a processing line 308 and into the pre-processing module 302. Suitable materials for the processing line 308 are steel, wrought iron. Generally cast iron, unalloyed copper, silver, or mercury are avoided because of possibility of forming explosive acetylides. In a preferred embodiment the pre-processing module includes a liquid bath 309 and the processing line 308 serves as an inlet for the acetylene gas stream into the bath 309. The acetylene gas stream in the processing line 308 may include some storage solvent vapor in addition to acetylene. The acetone concentration in the processing line is typically in range of about 0.5% to 5% depending on the current service pressure of the acetylene cylinder. The temperature of the acetylene gas stream in the line 308 depends on the storage conditions of the acetylene cylinder, evaporation rate and other factors.

In one embodiment, the liquid bath 309 may contain a coolant 310. For example, the coolant may comprise ethylene glycol and water, but other coolants may also be used. For example, Dynalene HF-LO (aliphatic hydrocarbon), Dynalene MV (hydrocarbon blend), Syltherm XLT may be used. One or more heat exchangers in the acetylene flow path may also be provided in liquid bath 309. For example in the depicted embodiment, one heat exchange 311 is attached to the processing line 308, while another heat exchanger 324 is attached to an exit line 326. However, the bath may contain any number of heat exchangers. The number and the design of the heat exchanger depends on the flow rates in the line 308, the required concentration of the storage solvent in the exit line 326, various design parameters of the liquid bath 309 and other factors.

The acetylene gas stream is initially cooled in the heat exchanger 311. Depending the process requirement the acetylene gas stream may be cooled to temperature within a few degrees of that of the coolant. Various heat exchanger types may be used. In a specific embodiment, a coiled heat exchange design is used with stainless steel tubing, such as 316 SS, of about 0.5" diameter and the surface area of between about 100 to 1000 square inches. In one specific embodiment, the surface area of the heat exchangers is between about 200 and 600 square inches. Initial condensation of the storage solvent from the acetylene gas stream occurs on the wall of the heat exchanger 311. As described above, acetone has a substantially higher boiling temperature than acetylene. Therefore, there will be substantially more acetone condensing on the walls of the heat exchanger 311 than acetylene. However, some acetylene will dissolve in the liquid acetone that is present throughout the pre-processing module 302. While it is desirable to cool the acetylene gas stream to very low temperatures to remove most of the acetone, a minimal temperature may exist to minimize acetylene losses into the liquid stream. In one embodiment, the acetylene gas stream is cooled down to −30° C. to −60° C. inside the pro-processing module 302.

The condensed storage solvent and the acetylene gas stream proceed from heat exchanger 311 to a liquid trap 312. The flow of condensed storage solvent is driven by gravity and the concurrent flow of the gas stream based on the pressure differential with the overall system. The trap 312 is designed to separate the condensed storage solvent from the acetylene gas stream and collect the condensed storage solvent at the bottom of the trap. The liquid collected at the bottom of the trap is primarily condensed storage solvent but may also include some dissolved acetylene. The liquid serves as a barrier for the acetylene gas stream and prevents it from escaping into a collection canister 320. The collected liquid is allowed to escape into the exit line 326. Therefore, the liquid level should be maintained between certain minimum and maximum levels within the trap. In certain embodiments, a level sensor 316 is employed to maintain the liquid level. Alternatively, a simple mechanical liquid trap may be used in a line leading to the collection canister 320. For example, a simple U-, S-, or J-shaped pipe trap may be installed in this line. In a specific embodiment, a radar sensor, suitable for hazardous environment, using either wavelength in Infrared Red and Radio Frequency regions may be used. In one specific embodiment, a sensor operating at 6.3 GHz is used to track the level of the fluid. The level sensor then sends a signal to a programmable logic controller (PLC) 338 More details on the operations of the trap are described in the context of the FIG. 5.

To reach and maintain desired temperature of the bath 309, the coolant 310 is circulated through a chiller 314. Any type of chiller may be used. In a preferred embodiment, the chiller 314 uses a cyclic refrigeration principle, such as a reverse-Rankine vapor-compression refrigeration. The chiller 314 is typically located in a separate facility and includes a pump to circulate the coolant 310 between the bath 309 and the chiller 314. The bath may also include an agitator 334 that provides additional forced convection of the coolant in the bath 309. The agitator 334 may include a motor and a propeller-type mixer at the end of the shaft of the motor that extends into the bath. The motor may be of any type, such as electrical or pneumatic. The agitator 334 may be positioned close to the heat exchangers 311 and 324 to ensure adequate coolant flow around the external surfaces of the heat exchangers.

The gas stream from the trap 312 may be directed into another heat exchanger 324 that is similarly submerged into the coolant 310 of the bath 309. The desirability of employing another heat exchanger 324 may depend on the temperature of the coolant, flow rates of the acetylene gas stream and design of all heat exchangers present in the pre-processing module 302. In the preferred embodiment, the heat exchanger 324 is equivalent to the first heat exchanger 311. The heat exchanger 324 is installed after the trap 312 and before the exit line 326 with respect to the flow of the acetylene gas stream. The heat exchanger 324 provides for additional cooling of the acetylene gas stream and further condensation of the storage solvent from the stream. The condensed liquid is drained inside the heat exchanger 324 back into the trap by gravitation and against the flow of the acetylene gas stream. Therefore, the internal size of piping used in the preferred embodiment must be sufficient to accommodate for this reverse flow. Some of the condensed liquid may be present as a mist in the gas stream. A mist trap may be integrated along the flow of the acetylene gas stream in or before the exit line 326.

The liquid being collected from one or more heat exchangers then accumulates in the trap. When it reaches a certain level, a drain valve 318 leading to the collection canister 320 opens and the liquid gravitationally flows into the collection canister 320. The valve closes when the liquid level reaches or falls below a certain minimum liquid level also controlled by the level sensor 316. The collection canister 320 is kept at a low temperature and low pressure to avoid reaching pressures above 15 psig. The condensed storage solvent may contain a substantial amount of condensed and dissolved acetylene. The temperature of the liquid leaving the bath 309 is close to the temperature of the bath 309 itself. In the preferred embodiment, the bath 309 temperature is maintained at about −30° C. to −60° C. Increasing the temperature of the liquid in the collection canister 320 will lead to acetylene evaporation from the liquid. To prevent the acetylene pressure from exceeding 15 psig, the collection canister 320 is maintained and near atmospheric pressure. The liquid is then transferred or evaporated into an abatement unit 322. Various method of disposing the liquid may be used. In the preferred embodiment, the abatement unit 322 burns anything supplied from the collection canister 320.

The acetylene gas stream then proceeds into the exit line 326. The concentration of the storage solvent is substantially reduced in the acetylene gas stream at this point. For clarity, the stream in the exit line is referred to as a reduced storage solvent concentration acetylene gas stream. The temperature of this stream in the exit line 326 may be within a few degrees of the coolant temperature. Since many of gas properties are dependent on the temperature and may affect operation of the mass flow controller 330 and impact the deposition process in the deposition chamber 332, the stream is first passed though a heater 328. Various heater types may be used. In certain embodiments, the heater can maintain the temperature of the reduced storage solvent concentration acetylene gas stream between about 10° C. and 50° C. In one specific embodiment, the temperature is maintained between about 15 and 30° C.

The acetylene gas stream with reduced storage solvent concentration then flows through the mass flow controller (MFC) 330 and into the deposition chamber 332. The MFC 330 may be calibrated relative to specific ranges for the properties of the reduced storage solvent concentration acetylene gas stream, such as temperature, composition, pressure, desired flow rate, and others. The MFC 330 may be fitted with a closed loop control system which is given an input signal by the operator or an external system, wherein the input value is compared to a value from the mass flow sensor and a valve of the MFC is adjusted accordingly to achieve the required flow rate.

Finally, the reduced acetone concentration acetylene gas stream flows into the deposition chamber 332. The pre-processing module is typically designed to interface with the deposition chamber. This may involve providing it with specifically designed and/or selected flow tubes (including specific sizes, geometries and orientations) at the interface as well as specific fittings for direct coupling to the deposition chamber. Several types of fittings may be used for connecting the deposition chamber 332 to the pre-processing module 302. For example, Swagelok VCR Face-Seal fitting or Swagelok VCR tube fittings may be used for this interconnection. Other vacuum types and low-pressure gas connection types of fittings may be used. In some embodiments, the fittings may be specifically designed be compatible with semiconductor equipment and overall semiconductor processing. The deposition chamber 332 is described in more details in the context of FIG. 7. The reduced acetone concentration acetylene gas stream may be used as a carbon containing precursor that is used to form a layer of high carbon content material on a semiconductor substrate during fabrication of an electronic device. This process is performed in the deposition chamber 332.

Figure 4:
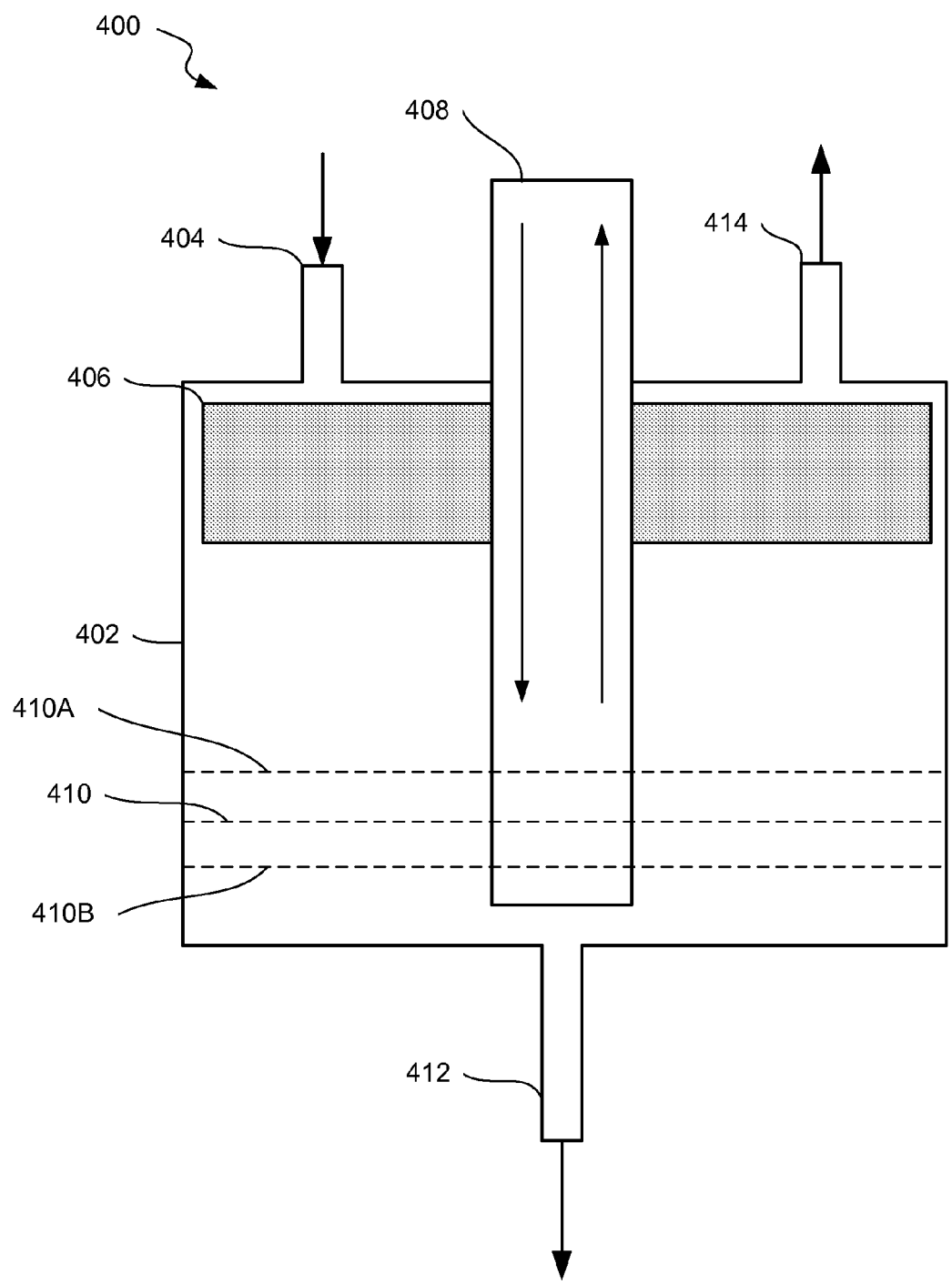
FIG. 4 presents a block diagram of a trap for collecting and disposing condensed storage solvent in accordance with the present invention.

FIG. 4 is a schematic diagram of a trap 400 used in a typical acetylene pre-processing module of this invention. With reference to FIG. 4, trap 400 may be an example of the element 312. The trap 400 includes a body 402 which includes a gas stream inlet line 404, a gas stream outlet line 414, and a condensed liquid outlet 412. The gas stream inlet line 404 and the gas stream outlet line 414 may be attached to heat exchangers or other elements of the pre-processing module. The acetylene gas stream enters into the trap 400 through the inlet line 404. The stream has been already cooled before entering the trap and usually includes some liquid, such as condensed storage solvent with some dissolved acetylene. The liquid may be coming from the walls of the inlet line 404 or in the form of the mist, i.e. small droplets suspended in the acetylene gas stream. The trap 400 may include a mist barrier 406 that assists in separating the liquid from the acetylene gas stream. The mist barrier 406 could be made of any suitable material that is resistant to storage solvent and acetylene and can withstand process temperatures (up to −80° C.). In the preferred embodiment, the mist barrier 406 can be highly porous aluminum block (i.e. aluminum foam). The mist barrier 406 may have tortuous paths for the acetylene gas stream to pass through while trapping the liquid on the side of these paths. The liquid then flows back to the bottom of the trap 400. The porosity of the mist barrier 406 should be sufficiently open for the liquid to flow and not block the acetylene gas stream inside the trap. The mist trap 406 may also provide additional condensation surface for the storage solvent remaining in the acetylene gas stream.

As indicated, the condensed liquid gravitationally flows to the bottom of the trap 400. The liquid is then removed through the condensed liquid outlet 412. As explained with reference to FIG. 4, the removal of liquid may depend on a liquid level 410 at the bottom of the trap. When the liquid level 410 reaches a certain maximum value 410A the draining valve of the pre-processing module is opened and the condensed liquid is drained through the condensed liquid outlet 412. Draining is then stopped when the liquid level 410 reaches or falls below a certain minimum value 410B. Monitoring of the liquid level 410 within the trap 400 is done through a sensor path 408 that provides a direct exposure of the liquid level to a liquid level sensor.

The acetylene gas stream then leaves the trap 400 through the gas line outlet 414. As explained above, the stream may then enter another heat exchanger where addition condensation may occur. Any additional condensation the outlet gas line 414 returns to the bottom of the trap 400.

EXAMPLES

The following examples are provided to further illustrate aspects and advantages of the present invention. These examples ate provided to exemplify and more clearly illustrate aspects of the present invention and are in no way intended to be limiting.

Figure 5:
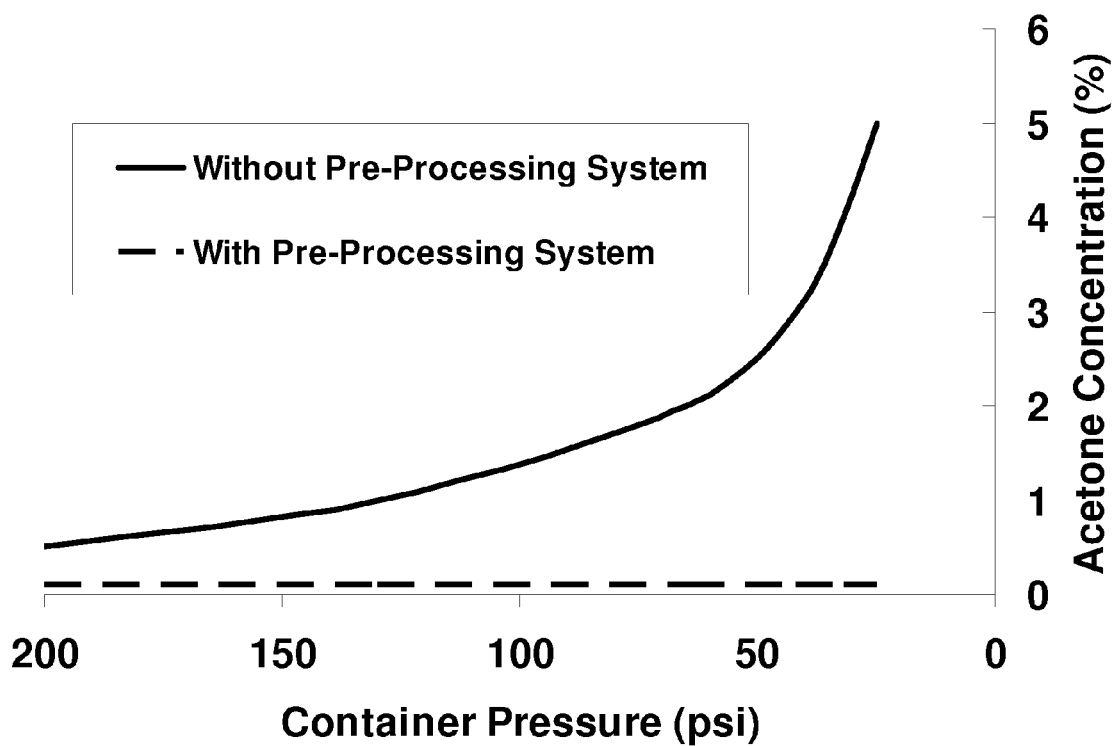
FIG. 5 is a plot of acetone concentration in the acetylene gas stream entering the deposition chamber as a function of the cylinder pressure, wherein the solid line represents acetone concentration in the acetylene gas stream that was not treated in the pre-processing module and the dashed line represents acetone concentration in the acetylene gas stream that was treated in the pre-processing module in accordance with the present invention.

FIG. 5 illustrates a plot of acetone concentration in the acetylene gas stream entering a deposition chamber. The solid line represents the acetone concentration without using the pre-processing system. As described above, acetylene may be stored in a container where acetylene is pressurized to approximately 250 psi and dissolved in acetone. As acetylene is consumed, the pressure in the container decreases. More acetone is evaporated at lower pressures. As a result the acetone concentration in the gas stream leaving the container increases. Without the pre-processing module (solid line), the acetylene gas stream is carried directly into the deposition chamber. The experimental results indicate that for a fresh acetylene container at about 200 psi the concentration of acetone in the acetylene gas stream is about 0.29%-0.32% by volume. However, when the pressure drops to 100 psi the concentration increases to 1.5 volumetric %. The volumetric concentration reaches 2.5% for 50 psi and continues to increase at even lower pressures. One way to provide an acetylene gas stream with acceptable concentration is to use only 20% by mass of acetylene contained in a fresh acetylene container. However, the remaining 80% of the acetone is wasted, and the acetone concentration is still high even for the 20% of the available acetylene.

The dashed line of FIG. 5 represents the acetone concentration in the gas stream after the gas stream is passed through a pre-processing module of the type described herein. Most of the acetone is removed from the gas stream in the module and the acetone concentration was maintained at substantially constant levels at below 0.4 volumetric %. Ashable hard mask deposition may substantially benefit from both low and constant concentration of the storage solvent in the acetylene gas stream entering the deposition chamber. FIG. 5 illustrates that the pre-processing module allows achieving both of these objectives. In a specific embodiment, the concentration of the storage solvent may be kept at about 0.1 volumetric % within less than 0.05% fluctuation. More generally, any storage solvent concentration between about 0 volumetric % and 0.4 volumetric % (or about 0 volumetric % to 0.1 volumetric %) may be steadily maintained in the acetylene gas stream entering the deposition chamber. The stable levels may correspond to variations of between about 0.01 volumetric % and 0.2 volumetric %. These requirements are typically driven by deposition.

Figure 6:
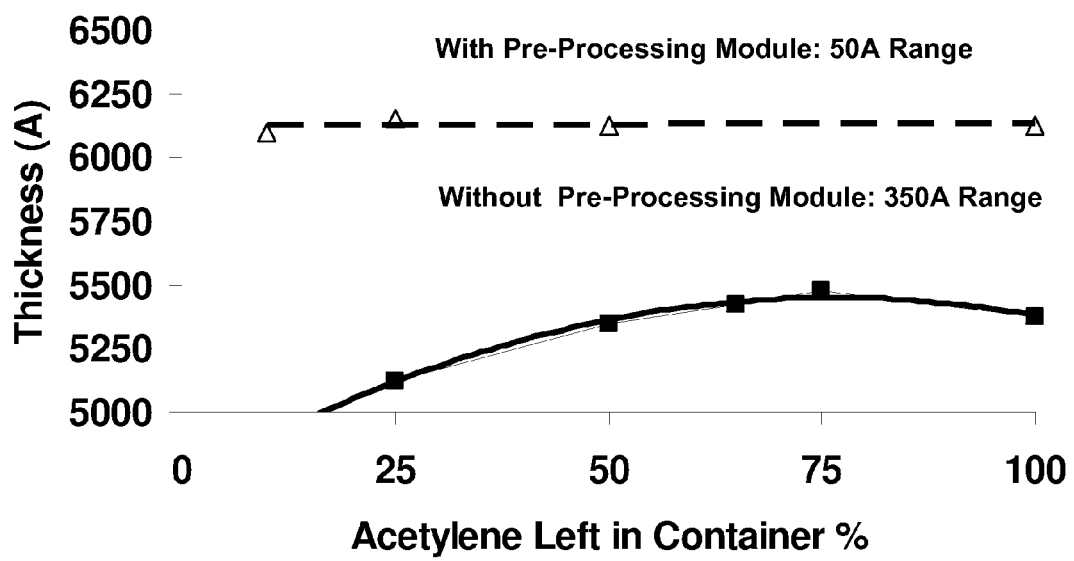
FIG. 6 is a plot of thickness of layers of high carbon content materials as a function of amount of acetylene remaining in the cylinder, wherein the solid trend line represents acetone concentration in the acetylene gas stream that was not treated in the pre-processing module and the dashed trend line represents acetone concentration in the acetylene gas stream that was treated in the pre-processing module in accordance with the present invention.

FIG. 6 illustrates a plot of ashable hard mask film thickness as function of acetylene remaining in the container. The bottom solid line corresponds to the film thickness deposited using the acetylene gas stream directly from an acetylene container and without utilizing a pre-processing module. The plot indicates substantial variations (350 angstroms) in film thickness based on the amount of the acetylene remaining in the container. Estimating the average film thickness at about 5375 angstroms, the thickness variation is then approximately 6.5 percent. The top line corresponds to film thickness deposited using the acetylene gas stream first treated in a pre-processing module. The variation in film thickness was only about 50 angstroms for the same life span of the acetylene container. Estimating the average film thickness at about 6125 angstroms, the thickness variation is then approximately 0.8 percent.

The variations in thickness result presented in plot resulted from variation in deposition rates. Without being restricted to any particular theory, it is believed that deposition rate variation depends on the amount of acetone or any other storage solvent in the acetylene gas stream. The plot of FIG. 5 indicates that the concentration of acetone in the gas stream varies with container pressure, i.e. amount of acetylene gas stream that has already been consumed from the container. Therefore, varying amount of acetone enters into the deposition chamber even through the flow of acetylene gas stream can be maintained relatively constant. These variations impact the deposition rate and the resulting thickness of the of ashable hard mask film.

Apparatus

The present invention is preferably implemented in a plasma enhanced chemical vapor deposition (PECVD) reactor. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing hard mask deposition is transferred from one station to another within a reactor chamber during the process. For example, for a 2000 Å hard mask film deposition, 500 Å of film may be deposited at each of four stations in accordance with the present invention. Of course, the full film deposition may occur entirely at a single station or any fraction of the total film thickness may be deposited at any number of stations.

While in process, each wafer is held in place by a pedestal, wafer chuck and/or other wafer holding apparatus. For certain operations in which the wafer is to be heated, the apparatus may include a heater such as a heating plate. In a preferred embodiment of the invention, a Vector™ (e.g., C23 Vector) or Sequel™ (e.g., C2 Sequel) reactor, produced by Novellus Systems of San Jose, Calif., may be used to implement the invention.

Figure 7:
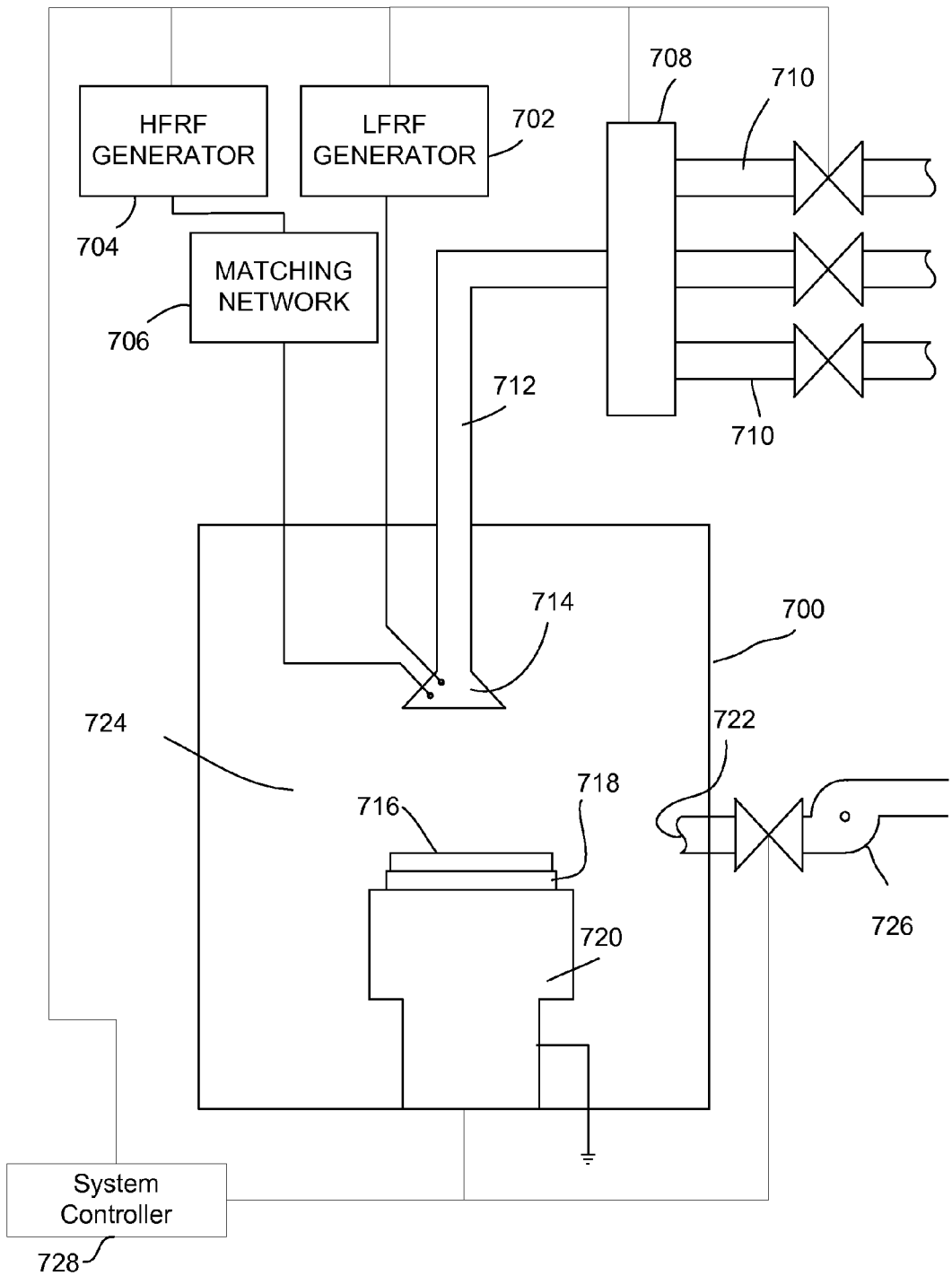
FIG. 7 is a block diagram depicting a PECVD reactor arranged for depositing a layer of high carbon content material on a semiconductor substrate.

FIG. 7 provides a simple block diagram depicting various reactor components arranged for implementing the present invention. As shown, a reactor 700 includes a process chamber 724, which encloses other components of the reactor and serves to contain the plasma generated by a capacitor type system including a showerhead 714 working in conjunction with a grounded heater block 720. A high-frequency RF generator 704, connected to a matching network 706, and a low-frequency RF generator 702 are connected to showerhead 714. Alternatively, a low-frequency RF generator 702 may connected to the substrate 716. The power and frequency supplied by matching network 706 is sufficient to generate a plasma from the process gas, for example 400-700 W total energy. In a typical process, the high frequency RF component is generally between 2-60 MHz; in a preferred embodiment, the HF component is 13.56 MHz. The LF component can be from 100 kHz-2 MHz; in a preferred embodiment, the LF component is 400 kHz.

Within the reactor, a wafer pedestal 718 supports a substrate 716. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 712. Multiple source gas lines 710 are connected to manifold 708. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 700 via an outlet 722. A vacuum pump 726 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

The invention may be implemented on a multi-station or a single station tool. In one embodiment, the pre-processing module is used for treating acetylene gas stream supplied to a semiconductor deposition chamber. Any deposition chamber that may use acetylene for semiconductor manufacturing can be used with pre-processing modules of this invention. In specific embodiments, the 300 mm Novellus Vector™ tool having a 4-station deposition scheme or the 200 mm Novellus Sequel™ tool having a 6-station deposition scheme can be used. Other deposition chambers may also be used.

In one specific embodiment, a 300 mm Novellus Vector™ tool with 4 deposition stations may be used to deposit an ashable hardmask onto a 300 mm wafer. The process may include four operations: undercoat deposition, ashable hard mask pre-coat, ashable hard mask deposition, and chamber cleaning. The acetylene gas stream may be used in the ashable hard mask pre-coat and ashable hard mask deposition operations only. The acetylene gas stream gas stream that passes through the pre-processing module may be delivered at 6,750 sccm during these operations. The dual-frequency PECVD module may provide Low Frequency (LF) power of about 200-600 W and High Frequency (HF) power at about 900-1500 W during these operation, while the process chamber was maintained at approximately 4-12 Torr.

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein. All references cited herein are incorporated by reference for all purposes.

What is claimed is:

1. A method of treating an acetylene gas stream prior to use in forming a layer of high carbon content material on a semiconductor substrate during fabrication of an electronic device, the method comprising:
    (a) delivering the acetylene gas stream to an inlet of an pre-processing module disposed upstream from a deposition chamber for forming the layer of high carbon content material wherein the acetylene gas stream is provided from an acetylene source comprising storage solvent in which acetylene is soluble;
    (b) condensing said storage solvent from the acetylene gas stream in the pre-processing module to provide a reduced storage solvent concentration in the acetylene gas stream having a substantially constant concentration of said storage solvent over a time period during which said layer of high carbon content material is deposited on the semiconductor substrate, wherein the substantially constant concentration of storage solvent is not greater than about 0.4% by volume in the reduced storage solvent concentration acetylene gas stream, as said reduced storage solvent concentration acetylene gas stream exits the pre-processing module; and
    (c) delivering said reduced storage solvent concentration acetylene gas stream from the pre-processing module to the deposition chamber,
    wherein delivering said reduced storage solvent concentration acetylene gas stream comprises passing said reduced storage solvent concentration acetylene gas stream through a heater configured to heat said reduced storage solvent concentration acetylene gas stream.

2. The method of claim 1, wherein the layer of high carbon content material comprises amorphous carbon.

3. The method of claim 1, wherein the layer of high carbon content material forms an ashable hard mask on said semiconductor substrate.

4. The method of claim 1, wherein delivering the acetylene gas stream to the inlet of the pre-processing module is performed at pressure below 15 psig.

5. The method of claim 1, wherein the storage solvent in which acetylene is soluble is acetone.

6. The method of claim 5, wherein the pre-processing module comprises of a heat exchanger with surface area between 100 square inches and 1000 square inches submerged into a bath and having a liquid trap comprising an insert having a plurality of tortuous paths for the acetylene gas stream to pass through.

7. The method of claim 1, wherein the pre-processing module comprises of a heat exchanger and a liquid trap.

8. The method of claim 7, wherein the heat exchanger is submerged in a bath filled with coolant.

9. The method of claim 8, wherein the coolant is maintained at a temperature not greater than about −35° C.

10. The method of claim 7, wherein the heat exchanger surface area is between 100 square inches and 1000 square inches.

11. The method of claim 7, wherein the liquid trap comprises an insert having a plurality of tortuous paths for the acetylene gas stream to pass through.

12. The method of claim 1, wherein the acetylene gas stream has a flow rate of up to about 20 L/min during the time period during which said layer of high carbon content material is deposited on the semiconductor substrate.

13. The method of claim 1, wherein the substantially constant concentration of the storage solvent is no greater than about 0.3% by volume in the reduced storage solvent concentration acetylene gas stream.

14. The method of claim 1 further comprising heating the reduced storage solvent concentration acetylene gas stream before or while delivering said reduced storage solvent concentration acetylene gas stream from the pre-processing module to the deposition chamber.

15. The method of claim 14, wherein said reduced storage solvent concentration acetylene gas stream is heated to between about 10 to 40° C.

16. The method of claim 1, wherein the acetylene source comprises a container and wherein no less than about 50% of acetylene in the container is delivered to the inlet of the pre-processing module.

17. The method of claim 1, wherein the acetylene source comprises a container and wherein no less than about 75% of acetylene in the container is delivered to the inlet of the pre-processing module.

18. The method of claim 17, wherein deposition rate of the layer of high carbon content material deposited on the semiconductor substrate varies by less than about 2% during the delivery of the acetylene gas stream from the container.

19. The method of claim 17, wherein deposition rate of the layer of high carbon content material deposited on the semiconductor substrate varies by less than about 1% during the delivery of the acetylene gas stream from the container.

20. The method of claim 1, wherein the layer of high carbon content material is deposited on the semiconductor substrate using Plasma Enhanced Chemical Vapor Deposition (PECVD).

21. The method of claim 20, wherein the PECVD utilizes dual frequency plasma generation.

22. The method of claim 20, wherein the PECVD comprises a Low Frequency (LF) plasma generator and a High Frequency (HF) plasma generator.

23. The method of claim 1, wherein delivering said reduced storage solvent concentration acetylene gas stream comprises directly transferring said stream from the pre-processing module to the deposition chamber.

24. The method of claim 1, wherein delivering said reduced storage solvent concentration acetylene gas stream comprises controlling a flow of said stream with a mass flow controller.

25. The method of claim 1 further comprising heating the reduced storage solvent concentration acetylene gas stream.

26. The method of claim 1, wherein delivering said reduced storage solvent concentration acetylene gas stream from the pre-processing module to the deposition chamber is performed at a flow rate of between about 3,000 sccm and 10,000 sccm.

27. The method of claim 1, wherein delivering said reduced storage solvent concentration acetylene gas stream from the pre-processing module to the deposition chamber is performed at a flow rate of between about 5,000 sccm and 8,000 sccm.

28. The method of claim 1, wherein delivering said reduced storage solvent concentration acetylene gas stream from the pre-processing module to the deposition chamber comprises combining said reduced storage solvent concentration acetylene gas stream with one or more carbon containing precursors selected from the group consisting of methane, ethylene, propylene, butane, cyclohexane, benzene, and toluene.

* * * * *